United States Patent
Liang et al.

(10) Patent No.: US 12,164,733 B2
(45) Date of Patent: Dec. 10, 2024

(54) METAL MESH ARRAY AND MANUFACTURING METHOD THEREOF, THIN FILM SENSOR AND MANUFACTURING METHOD THEREOF

(71) Applicants: Beijing BOE Technology Development Co., Ltd., Beijing (CN); BOE TECHNOLOGY GROUP CO., LTD., Beijing (CN)

(72) Inventors: Kui Liang, Beijing (CN); Feng Qu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/802,121

(22) PCT Filed: Sep. 18, 2021

(86) PCT No.: PCT/CN2021/119329
§ 371 (c)(1),
(2) Date: Mar. 23, 2023

(87) PCT Pub. No.: WO2023/039881
PCT Pub. Date: Mar. 23, 2023

(65) Prior Publication Data
US 2024/0211082 A1 Jun. 27, 2024

(51) Int. Cl.
*G06F 3/041* (2006.01)
*G06F 3/044* (2006.01)
(52) U.S. Cl.
CPC .. *G06F 3/0446* (2019.05); *G06F 2203/04103* (2013.01); *G06F 2203/04112* (2013.01)
(58) Field of Classification Search
CPC ........... G06F 2203/04112; G06F 3/041; G06F 3/0446; G06F 2203/04103; C23C 18/16; H01L 31/0224
See application file for complete search history.

(56) References Cited

U.S. PATENT DOCUMENTS 10,901,567 B2  1/2021 Lee et al.
11,003,298 B2  5/2021 Li et al.
(Continued)

FOREIGN PATENT DOCUMENTS

CN   106020528 A   10/2016
CN   108539386 A   9/2018
(Continued)

OTHER PUBLICATIONS

China Patent Office, First Office Action dated Jul. 26, 2024, for corresponding Chinese application 202180002605.2.

*Primary Examiner* — Dennis P Joseph
(74) *Attorney, Agent, or Firm* — HOUTTEMAN LAW LLC

(57) ABSTRACT

The present disclosure provides a metal mesh array and a manufacturing method thereof, a thin film sensor and a manufacturing method thereof, and belongs to the field of electronic device technology. A method for manufacturing a metal mesh array includes: providing a base substrate; forming a first metal layer on the base substrate as a seed layer; forming a first interlayer dielectric layer on a side of the seed layer away from the base substrate such that the first interlayer dielectric layer includes first groove structures and second groove structures in working areas and arranged in an intersecting manner; and performing an electroplating process on the seed layer to form first metal lines in the first groove structures and second metal lines in the second groove structures. The first metal lines and second metal lines in each working area are arranged in an intersecting manner, thereby forming a metal mesh.

16 Claims, 12 Drawing Sheets

(56) References Cited

U.S. PATENT DOCUMENTS

| | | |
|---|---|---|
| 2009/0239331 A1 | 9/2009 | Xu et al. |
| 2015/0345042 A1 | 12/2015 | Yeh et al. |
| 2017/0036230 A1* | 2/2017 | Mizumura ............... B05D 7/24 |
| 2017/0271536 A1 | 9/2017 | Erben et al. |
| 2017/0293382 A1* | 10/2017 | Ishii ........................ G06F 3/041 |
| 2020/0310586 A1 | 10/2020 | Ding et al. |
| 2023/0107867 A1* | 4/2023 | Yang .................... F28D 15/046 |
| | | 361/700 |

FOREIGN PATENT DOCUMENTS

| | | |
|---|---|---|
| CN | 109213365 A | 1/2019 |
| CN | 110764636 A | 2/2020 |
| CN | 212257387 U | 12/2020 |
| CN | 112397541 A | 2/2021 |
| WO | WO2017074049 A1 | 5/2017 |
| WO | WO2021174426 A1 | 9/2021 |

* cited by examiner

METAL MESH ARRAY AND MANUFACTURING METHOD THEREOF, THIN FILM SENSOR AND MANUFACTURING METHOD THEREOF

TECHNICAL FIELD

The present disclosure relates to the field of electronic device technology, and in particular to a metal mesh array and a manufacturing method thereof, and a thin film sensor and a manufacturing method thereof.

BACKGROUND

At present, a micro-nano processing technology commonly used in the glass-based semiconductor industry is related to a line width of about 2 μm to 3 μm. Some thin film display and sensing devices (such as a transparent antenna or a radio frequency device) put a higher requirement on the line width for the micro-nano processing. The transparent antenna mainly uses a metal mesh having a narrow line width as a signal transmitting and receiving unit, while a shorter channel length is applied in the radio frequency device to achieve a higher cut-off frequency.

SUMMARY

The present disclosure is directed to solving at least one of the technical problems in the prior art, and provides a metal mesh array and a method for manufacturing the same, and a thin film sensor and a method for manufacturing the same.

In a first aspect, an embodiment of the present disclosure provides a method for manufacturing a metal mesh array, wherein the metal mesh array includes a plurality of working areas and a plurality of redundant areas; the plurality of working areas and the plurality of redundant areas are alternately arranged in both a first direction and a second direction; wherein the manufacturing method includes:
providing a base substrate;
forming a first metal layer on the base substrate as a seed layer;
forming a first interlayer dielectric layer on a side of the seed layer away from the base substrate; wherein the first interlayer dielectric layer includes a plurality of first groove structures and a plurality of second groove structures in the plurality of working areas and arranged in an intersecting manner; and
performing an electroplating process on the seed layer to form a plurality of first metal lines in the plurality of first groove structures and a plurality of second metal lines in the plurality of second groove structures, wherein the plurality of first metal lines and the plurality of second metal lines in the plurality of working areas are arranged in an intersecting manner, thereby forming a plurality of metal meshes.

Optionally, the first interlayer dielectric layer further includes a plurality of third groove structures and a plurality of fourth groove structures in the plurality of redundant areas and arranged with extending directions thereof intersecting with each other, and a plurality of dividing blocks at positions where the extending directions of the plurality of third groove structures and of the plurality of fourth groove structures intersect with each other; the plurality of dividing blocks divide the plurality of third groove structures into a plurality of groove portions, and divide the plurality of fourth groove structures into a plurality of groove portions; and
while performing an electroplating process on the seed layer to form a plurality of first metal lines in the plurality of first groove structures and a plurality of second metal lines in the plurality of second groove structures, the method further includes:
forming a plurality of third metal lines in the plurality of third groove structures and a plurality of fourth metal lines in the plurality of fourth groove structures, wherein the plurality of third metal lines and the plurality of fourth metal lines are disconnected at positions where the plurality of third metal lines and the plurality of fourth metal lines intersect with each other, and extending directions of the plurality of third metal lines and the plurality of fourth metal lines intersect with each other in the plurality of redundant areas, thereby forming a plurality of redundant metal meshes.

Optionally, the step of forming the first interlayer dielectric layer includes: through a hard mask exposure process and an inductively coupled plasma etching process, forming the plurality of first groove structures and the plurality of second groove structures in the plurality of working areas and arranged in an intersecting manner in the first interlayer dielectric layer; and/or forming the plurality of third groove structures and the plurality of fourth groove structures in the plurality of redundant areas and arranged with extending directions thereof intersecting with each other.

Optionally, the step of forming the first interlayer dielectric layer includes: through a nano-imprinting process and an inductively coupled plasma etching process, forming the plurality of first groove structures and the plurality of second groove structures in the plurality of working areas and arranged in an intersecting manner in the first interlayer dielectric layer; and/or forming the plurality of third groove structures and the plurality of fourth groove structures in the plurality of redundant areas and arranged with extending directions thereof intersecting with each other.

Optionally, the step of forming a seed layer on the base substrate includes: depositing a first metal layer on one side of the base substrate, wherein the first metal layer covers the base substrate; and wherein after the step of performing an electroplating process on the seed layer to form a plurality of first metal lines in the plurality of first groove structures and a plurality of second metal lines in the plurality of second groove structures, the method further includes:
stripping the base substrate; and
removing materials of the seed layer outside the plurality of first groove structures and the plurality of second groove structures in the first interlayer dielectric layer.

Optionally, the step of forming a seed layer on the base substrate includes:
depositing a first metal layer on one side of the base substrate, and forming a plurality of metal patterns through a patterning process; and
forming the first interlayer dielectric layer on a side of the seed layer away from the base substrate; and in the step that the first interlayer dielectric layer includes a plurality of first groove structures and a plurality of second groove structures in the plurality of working areas and arranged in an intersecting manner, the plurality of first groove structures and the plurality of second groove structures are arranged corresponding to the plurality of metal patterns.

Optionally, after providing a base substrate, the method further includes:

forming a second metal layer on one side of the base substrate; and the forming a first metal layer as a seed layer on the base substrate specifically includes: forming the first metal layer on a side of the second metal layer away from the base substrate, wherein an orthographic projection of the first metal layer on the base substrate coincides with an orthographic projection of the second metal layer on the base substrate.

Optionally, before the step of forming a second metal layer on one side of the base substrate, the method further includes:

forming a separation layer on the base substrate, wherein the separation layer covers the base substrate.

Optionally, after forming the plurality of metal meshes, the method further includes:

forming a flexible film on a side of the first interlayer dielectric layer away from the base substrate.

Optionally, after forming the plurality of the redundant metal meshes, the method further includes:

forming a flexible film on a side of the first interlayer dielectric layer away from the base substrate.

In a second aspect, an embodiment of the present disclosure provides a metal mesh array, including a plurality of working areas and a plurality of redundant areas; wherein the plurality of working areas and the plurality of redundant areas are alternately arranged in both a first direction and a second direction; the metal mesh array includes: a base substrate;

a first metal layer on the base substrate;

a first interlayer dielectric layer on one side of the first metal layer away from the base substrate, wherein the first interlayer dielectric layer includes a plurality of first groove structures and a plurality of second groove structures in the plurality of working areas and arranged in an intersecting manner; and a plurality of metal meshes, which include a plurality of first metal lines in the plurality of first groove structures and a plurality of second metal lines in the plurality of second groove structures.

Optionally, the first interlayer dielectric layer further includes a plurality of third groove structures and a plurality of fourth groove structures in the plurality of redundant areas and arranged with extending directions thereof intersecting with each other, and a plurality of dividing blocks at positions where the extending directions of the plurality of third groove structures and of the plurality of fourth groove structures intersect with each other; the plurality of dividing blocks divide the plurality of third groove structures into a plurality of groove portions, and divide the plurality of fourth groove structures into a plurality of groove portions; and the metal mesh array further includes:

a plurality of redundant metal meshes, which include a plurality of third metal lines in the plurality of third groove structures and a plurality of fourth metal lines in the plurality of fourth groove structures.

In a third aspect, an embodiment of the present disclosure provides a method of manufacturing a thin film sensor, including the above method of manufacturing a metal mesh array.

In a fourth aspect, an embodiment of the present disclosure provides a thin film sensor, including the above metal mesh array.

DETAIL DESCRIPTION OF EMBODIMENTS

In order to enable one of ordinary skill in the art to better understand the technical solutions of the embodiments of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
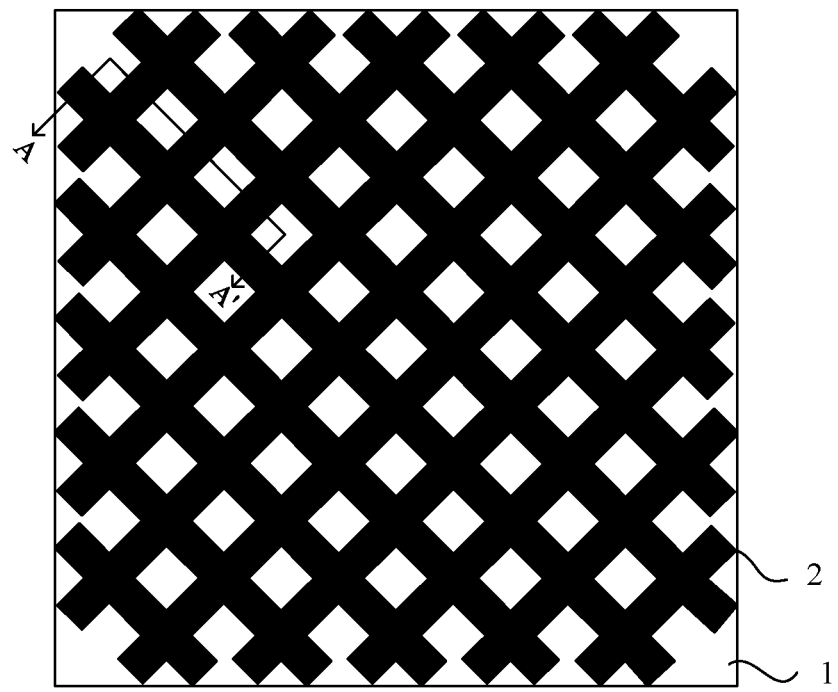
FIG. 1 is a schematic diagram of a structure of an exemplary thin film sensor.
Figure 2:
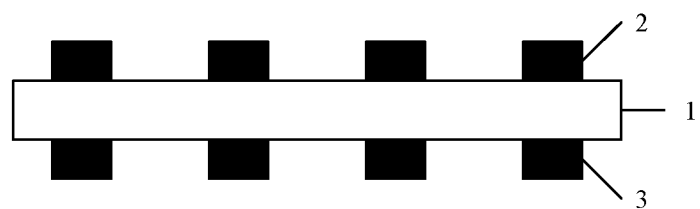
FIG. 2 is a schematic cross-sectional view of a structure of a thin film sensor shown in FIG. 1 along a A-A' direction.

FIG. 1 is a schematic diagram of a structure of an exemplary thin film sensor; FIG. 2 is a schematic cross-sectional view of a structure of a thin film sensor shown in FIG. 1 along a A-A' direction. As shown in FIGS. 1 and 2, the thin film sensor includes: a base substrate 1 having a first surface and a second surface, i.e. an upper surface and a lower surface, which are opposite to each other; a first conductive layer 2 and a second conductive layer 3 located on the first surface and the second surface of the base substrate 1, respectively. As an example, the thin film sensor is a transparent antenna, the first conductive layer 2 may be a radiation layer, and the second conductive layer 3 may be a ground layer. The radiation layer may be used as a receiving unit of the antenna and may also be used as a transmitting unit of the antenna.

In order to ensure that the first conductive layer 2 and the second conductive layer 3 have good light transmittance, the first conductive layer 2 and the second conductive layer 3 need to be patterned. For example, the first conductive layer 2 may be formed by mesh lines made of a metal material, and the second conductive layer 3 may also be formed by mesh lines made of a metal material. It is understood that the first conductive layer 2 and the second conductive layer 3 may alternatively be formed by a structure having other patterns, such as a block electrode having diamond-shaped, triangular patterns, etc., which is not listed herein. As may be seen from FIG. 1, the first conductive layer 2 and the second conductive layer 3, i.e., the mesh lines, are not provided on both whole surfaces of the base substrate 1, respectively. Any mesh line is formed by electrically connected metal meshes. Due to a material of the metal meshes and processes for forming the metal meshes, each metal mesh has a great line width, so that the light transmittance of the thin film sensor is severely influenced, and the use experience of a user is influenced.

It should be noted that the metal mesh is not limited to being applied in the antenna structure, and may alternatively be applied in a touch panel as a touch electrode. Alternatively, the metal mesh may be used in various metal lines, which is not listed herein.

In order to solve the above technical problems, an embodiment of the present disclosure provides a metal mesh array, a method for manufacturing a metal mesh array, and a thin film sensor. In the embodiment of the present disclosure, as an example, the metal mesh array is applied in an antenna as a receiving unit and/or a transmitting unit of the antenna, but it should be understood that this does not limit the scope of the embodiments of the present disclosure.

Figure 3:
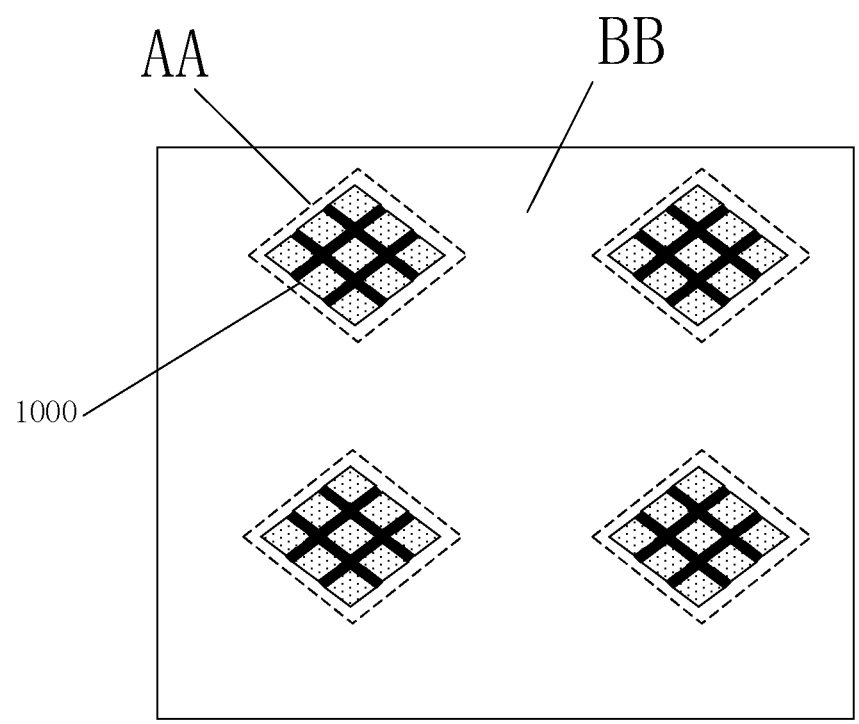
FIG. 3 is a schematic diagram of a structure of a metal mesh array according to an embodiment of the present disclosure.

FIG. 3 is a schematic diagram of a structure of a metal mesh array according to an embodiment of the present disclosure. As shown in FIG. 3, the embodiment of the present disclosure provides a metal mesh array, including a plurality of working areas AA and a plurality of redundant areas BB, and a plurality of metal meshes 1000 are disposed in the plurality of working areas AA. The working areas AA and the redundant areas BB are alternately arranged in both a first direction and a second direction. That is, in the metal mesh array, the metal meshes 1000 positioned in the working areas AA are arranged at intervals in a row direction and also arranged at intervals in a column direction.

The working area AA refers to an area where the metal mesh array is in a working state, and the redundant area BB refers to a non-working area where the metal mesh 1000 is not disposed. That is, the mesh lines in the metal mesh 1000 in each working area AA are continuous, and there is no break point at a position where mesh lines intersect with each other.

Figure 4:
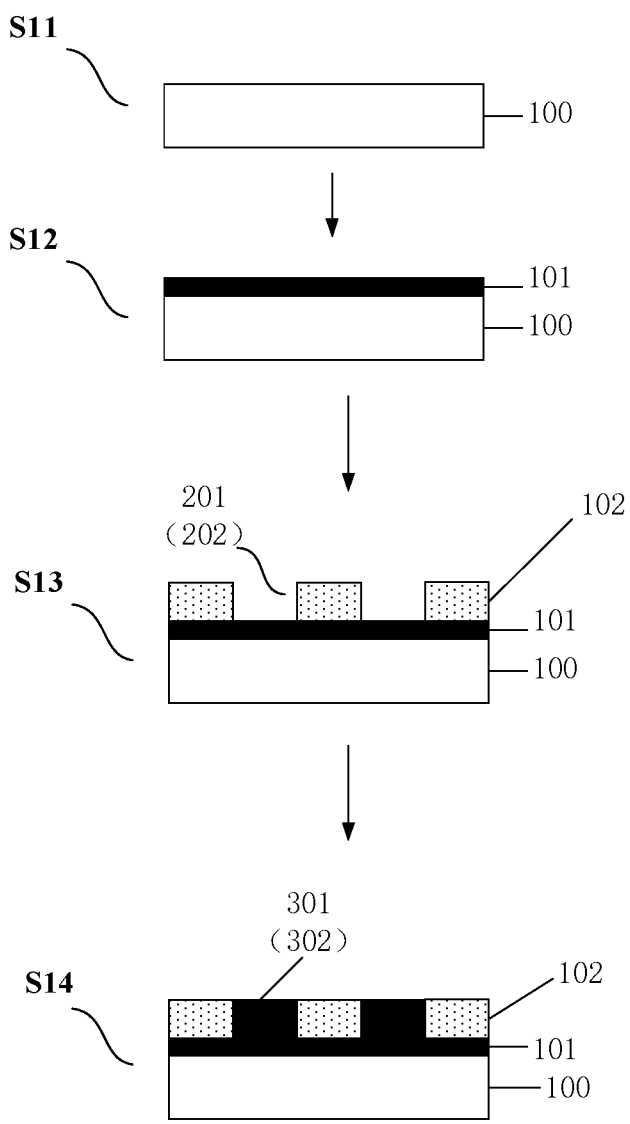
FIG. 4 is a flow chart of a method of manufacturing a metal mesh array according to an embodiment of the present disclosure.

FIG. 4 is a flow chart of a method of manufacturing a metal mesh array according to an embodiment of the present disclosure. As shown in FIG. 4, an embodiment of the present disclosure provides a method for manufacturing a metal mesh array, which is used for manufacturing the metal mesh array shown in FIG. 3. The method for manufacturing a metal mesh array includes the following steps:

S11, providing a base substrate 100.

A material of the base substrate 100 may be a flexible material or a rigid material. In the present embodiment, as an example, the material of the base substrate 100 is the rigid material. The rigid material may include, but is not limited to, glass, sapphire, quartz, or the like.

S12, forming a first metal layer 101 as a seed layer on the base substrate 100.

The first metal layer 101 may be formed on the base substrate 100 by evaporation or sputtering and used as a seed layer for a subsequent electroplating process. A material of the first metal layer 101 may be selected as needed. For example, the material of the first metal layer 101 may be one or more of copper, titanium, aluminum, and silver.

Figure 5:
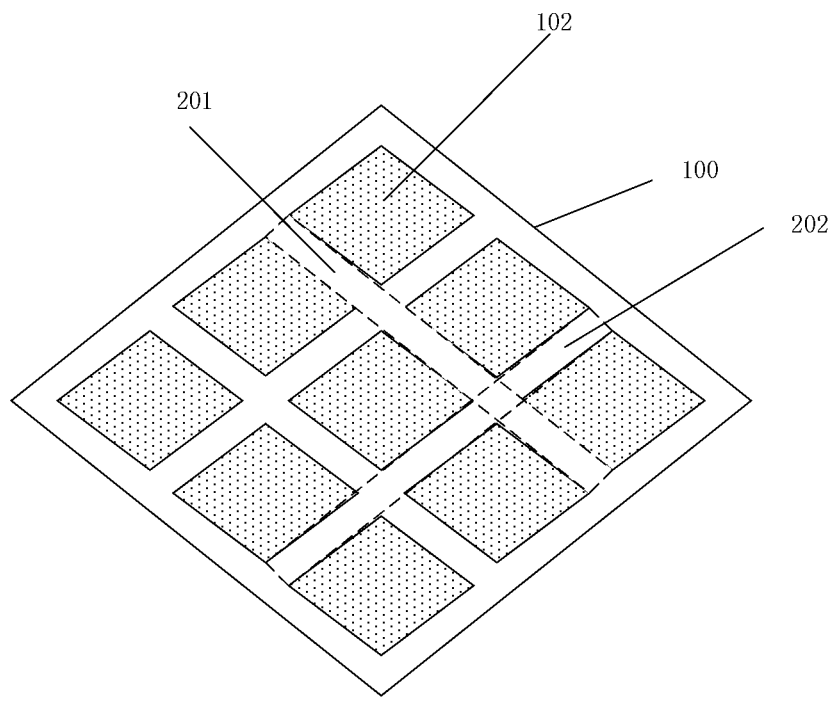
FIG. 5 is a top view of an intermediate product formed in step S13 of a method of manufacturing a metal mesh array according to an embodiment of the present disclosure.

S13, forming a first interlayer dielectric layer 102 on a side of the seed layer 101 away from the base substrate 100, where the first interlayer dielectric layer includes a plurality of first groove structures 201 and a plurality of second groove structures 202 located in the working areas (AA) and arranged in an intersecting manner (as shown in FIG. 5).

A material of the first interlayer dielectric layer 102 includes, but is not limited to, an organic material or an inorganic material. For example, the organic material includes, but is not limited to, polyimide, epoxy, acryl, polyester, photoresist, polyacrylate, polyamide, siloxane and other resin materials. For example, the inorganic material includes, but is not limited to, silicon oxide (SiOx), silicon nitride (SiNx), hafnium oxide (HfOx), silicon oxynitride (SiON), aluminum oxide (AlOx), and the like.

When the material of the first interlayer dielectric layer 102 is an organic material, the first interlayer dielectric layer 102 may be formed on the side of the seed layer 101 away from the base substrate 100 through a coating or spin-coating process. When the material of the first interlayer dielectric layer 102 is an inorganic material, the first interlayer dielectric layer 102 may be formed on the side of the seed layer 101 away from the base substrate 100 through a plasma enhanced chemical vapor deposition method, a low pressure chemical vapor deposition method, an atmospheric pressure chemical vapor deposition method, an electron cyclotron resonance chemical vapor deposition method, or a sputtering method.

In this step, the plurality of first groove structures 201 and the plurality of second groove structures 202 arranged in an intersecting manner may be formed through a patterning process. In an embodiment, the "patterning process" refers to a step of forming a structure having a specific pattern, and may be a photolithography process including one or more steps of forming a material layer, coating a photoresist, exposing, developing, etching, stripping a photoresist, and the like. Alternatively, the "patterning process" may also be an imprinting process, an inkjet printing process, or other processes.

It should be noted that in this embodiment, the first interlayer dielectric layer 102 may include one or more layers. In this embodiment, the first interlayer dielectric layer 102 is a single layer, as an example.

S14, performing an electroplating process on the seed layer 101 to form a plurality of first metal lines 301 located in the plurality of first groove structures 201 and a plurality of second metal lines 302 located in the plurality of second groove structures 202, wherein the first metal lines 301 and the second metal lines 302 in each working area AA are arranged in an intersecting manner, thereby forming a plurality of metal meshes 1000 in the working area AA.

Figure 6:
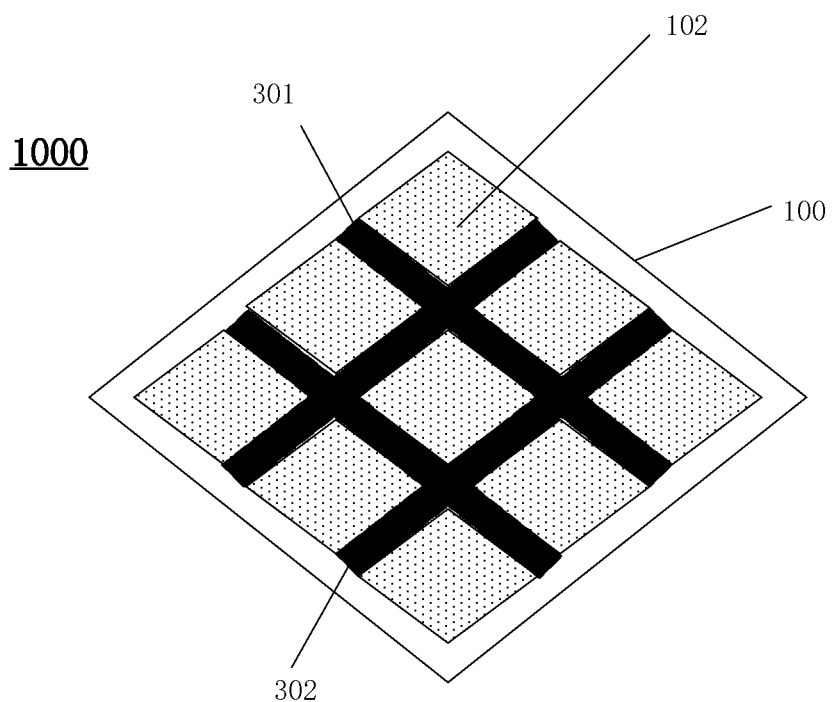
FIG. 6 is a top view of an intermediate product formed in step S14 of a method of manufacturing a metal mesh array according to an embodiment of the present disclosure.

The seed layer is electroplated through a line electroplating process to form the first metal lines 301 located in the first groove structures 201 and the second metal lines 302 located in the second groove structures 202, and the first metal lines 301 and the second metal lines 302 in each working area AA are arranged in an intersecting manner, thereby forming the plurality of metal meshes 1000 in the working areas AA (a structure of the metal mesh is shown in FIG. 6).

The "line electroplating process" is that electroplating leads are arranged in the first groove structures 201 and the second groove structures 202 on the seed layer 101. The metal is deposited in the groove structures at a high speed in the electroplating process, and the metal on side walls of the groove structures gradually grows and becomes thick over time, until the groove structures are completely filled, and finally, the plurality of metal lines are formed and arranged in an intersecting manner to form the plurality of metal meshes.

In this embodiment, the first interlayer dielectric layer 102 is formed on the side of the seed layer 101 away from the base substrate, the plurality of first groove structures 201 and the plurality of second groove structures 202 are formed in the first interlayer dielectric layer 102 through the patterning process, and the first metal lines 301 located in the first groove structures 201 and the second metal lines 302 located in the second groove structures 202 are formed through the line electroplating process, so as to form the plurality of metal meshes 1000. In this way, compared with the related art, steps of etching the metal may be reduced, which facilitates to increase a uniformity of a line width of a metal line and improve the yield of the metal line.

In some embodiments, the step of S13, forming a first interlayer dielectric layer 102 on a side of the seed layer 101 away from the base substrate 100, where the first interlayer dielectric layer includes a plurality of first groove structures 201 and a plurality of second groove structures 202 located in the working areas (AA) and arranged in an intersecting manner, specifically includes:

S131, forming the first interlayer dielectric layer 102 on the side of the seed layer 101 away from the base substrate 100.

The first interlayer dielectric layer is formed in the same manner as the first interlayer dielectric layer in step S13, and is not described herein again.

S132, forming the plurality of first groove structures 201 and the plurality of second groove structures 202 arranged in an intersecting manner in the first interlayer dielectric layer 102 through a hard mask exposure process and an inductively coupled plasma etching process.

The hard mask is an inorganic thin film material formed through a CVD (chemical vapor deposition). A main component of the hard mask is TIN, SiOx, SiNx or the like. The hard mask is primarily used in a multiple photolithography process, where multiple photoresist images are firstly transferred to the hard mask, and the final pattern is then etched through the hard mask and transferred to the base substrate.

In the present embodiment, for example, the hard mask layer (e.g., SiOx, SiNx, metal, ITO) is deposited on the first interlayer dielectric layer; a photoresist material (PR/BARC) is spin-coated on the hard mask layer; patterns of the first groove structures and the second groove structures are transferred onto the hard mask layer through exposure and development; and the residual photoresist is stripped, and then, the patterns of the first groove structures and the second groove structures on the hard mask are etched to the first interlayer dielectric layer through an inductively coupled plasma etching process (ICP).

In this embodiment, the groove structures are formed in the first interlayer dielectric layer through the processes of hard mask and ICP, which may ensure that the groove structures in the first interlayer dielectric layer are perpendicular to a surface of the base substrate, thereby facilitating a uniform line width of each metal mesh formed subsequently, and realizing an ultra-narrow line width of the formed metal line. The line width of the metal mesh refers to a width of a metal line formed by a metal material formed in each first groove structure or each second groove structure, the width of the metal line is equal to or approximately equal to a groove width of each first groove structure or each second groove structure. The line width of each metal mesh formed in the embodiment of the present disclosure may be less than or equal to 1.5 μm.

In some embodiments, the step of S13, forming a first interlayer dielectric layer 102 on a side of the seed layer 101 away from the base substrate 100, where the first interlayer dielectric layer includes a plurality of first groove structures 201 and a plurality of second groove structures 202 located in the working areas (AA) and arranged in an intersecting manner, specifically includes:

The plurality of first groove structures 201 and the plurality of second groove structures 202 arranged in an intersecting manner are formed on the interlayer dielectric layer 102 through a nano-imprinting process and an inductively coupled plasma etching process.

In this embodiment, the groove structures are formed in the first interlayer dielectric layer through the nano-imprinting process and the inductively coupled plasma etching process, which may ensure that the groove structures in the first interlayer dielectric layer are perpendicular to a surface of the base substrate, thereby facilitating a uniform line width of each metal mesh formed subsequently, and realizing an ultra-narrow line width of the formed metal line.

Figure 7:
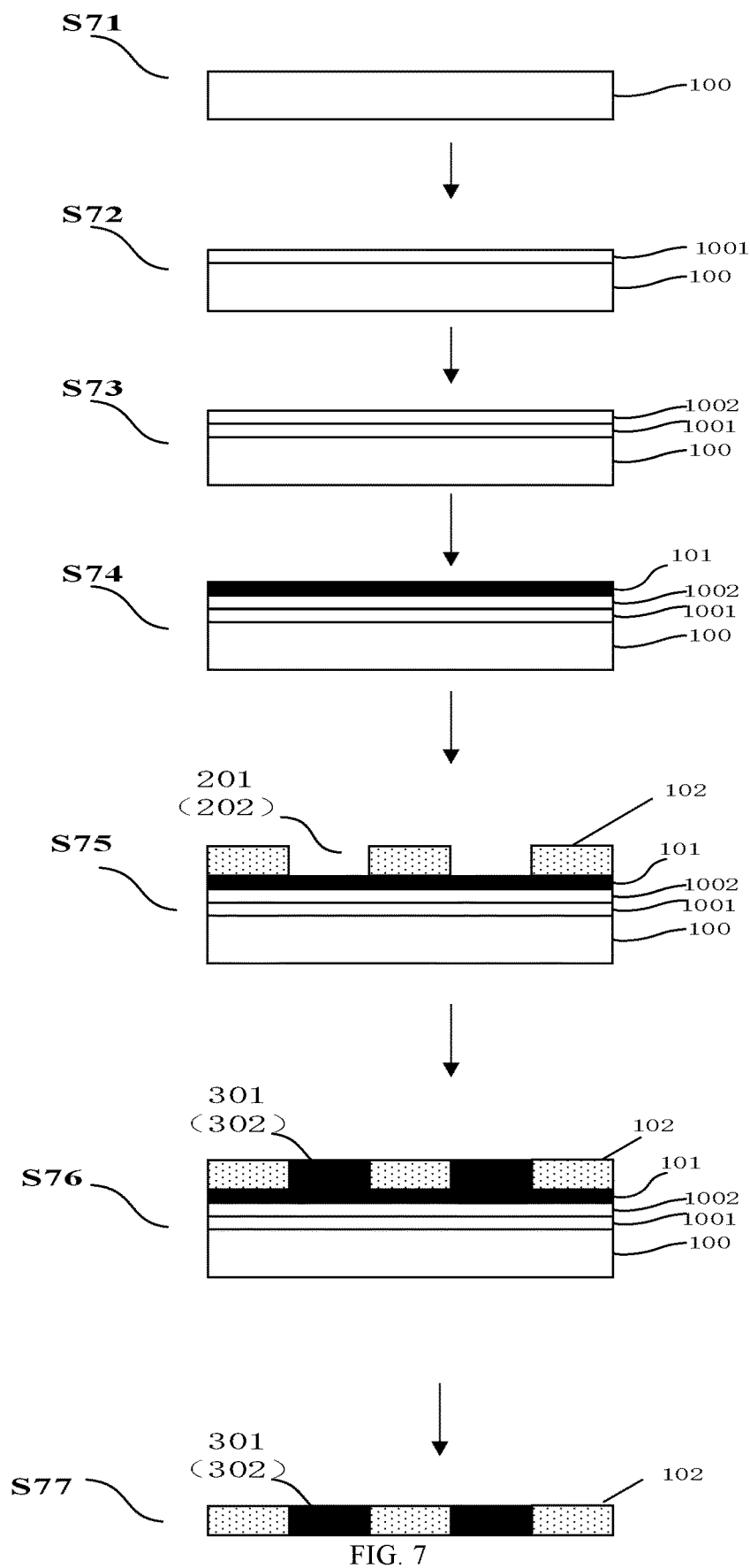
FIG. 7 is a flow chart of another method of manufacturing a metal mesh array shown in FIG. 3.

FIG. 7 is a flow chart of another method of manufacturing a metal mesh array shown in FIG. 3. As shown in FIG. 7, the manufacturing method of the metal mesh array specifically includes:

S71, providing a base substrate 100.

The step of S71 is the same as the step of S11, and is not repeated herein.

S72, forming a separation layer 1001 on the base substrate 100, wherein the separation layer 1001 covers the base substrate 100.

The separation layer 1001 may be formed on the base substrate 100 through a plasma enhanced chemical vapor deposition method, a low pressure chemical vapor deposition method, an atmospheric pressure chemical vapor deposition method, an electron cyclotron resonance chemical vapor deposition method, or a sputtering method.

S73, forming a second metal layer 1002 on a side of the separation layer 1001 away from the base substrate 100.

The second metal layer 1002 may be formed on the side of the separation layer 1001 away from the base substrate 100 by evaporation or sputtering.

S74, forming the first metal layer 101 on a side of the second metal layer 1002 away from the base substrate 100, wherein an orthographic projection of the first metal layer 101 on the base substrate 100 coincides with an orthographic projection of the second metal layer 1002 on the base substrate 100. A material of the first metal layer 101 is different from that of the second metal layer 1002. For example, the material of the first metal layer 101 is copper, and the material of the second metal layer 1002 is titanium.

The first metal layer 101 may be formed on the side of the second metal layer 1002 away from the base substrate 100 by evaporation or sputtering, and the first metal layer 101 serves as a seed layer for electroplating.

S75, forming the first interlayer dielectric layer 102 on a side of the first metal layer 101 away from the base substrate 100, wherein the first interlayer dielectric layer 102 includes the plurality of first groove structures 201 and the plurality of second groove structures 202 arranged in an intersecting manner.

The step of S75 is the same as the step of S13, and is not repeated herein. It may be understood that the groove structures may be formed in the first interlayer dielectric layer through the processes of hard mask and ICP, or through the nano-imprinting process and the inductively coupled plasma etching process, and the specific process is not described herein again.

S76, performing an electroplating process on the first metal layer 101 to form the plurality of first metal lines 301 located in the plurality of first groove structures 201 and the plurality of second metal lines 302 located in the plurality of second groove structures 202, where the first metal lines 301 and the second metal lines 302 are arranged in an intersecting manner, thereby forming the plurality of metal meshes 1000.

The step of S76 is the same as the step of S14, and is not repeated herein.

S77, stripping the separation layer 1001, and then, removing the second metal layer 1002 by etching, and removing a material of the first metal layer 101 outside the first groove structures 201 and the second groove structures 202 by etching, thereby obtaining the plurality of metal meshes.

The separation layer 1001 and the base substrate 100 may be stripped by laser irradiation, and the first metal layer 101 and the second metal layer 1002 may be removed by a dry etching or wet etching process.

In this implementation, the first metal lines located in the first groove structures and the second metal lines located in the second groove structures are formed through the line electroplating process, which increases a uniformity of a line width of a metal line and improves the yield of the metal line. In addition, the groove structures may be formed in the first interlayer dielectric layer through the processes of hard mask and ICP, or through the nano-imprinting process, which may ensure that the groove structures in the first interlayer dielectric layer are perpendicular to a surface of the base substrate, thereby facilitating a uniform line width of each metal mesh formed subsequently, and realizing an ultra-narrow line width of the formed metal line. Also, by providing the second metal layer, the adhesion of the first metal layer may be further increased.

Figure 8:
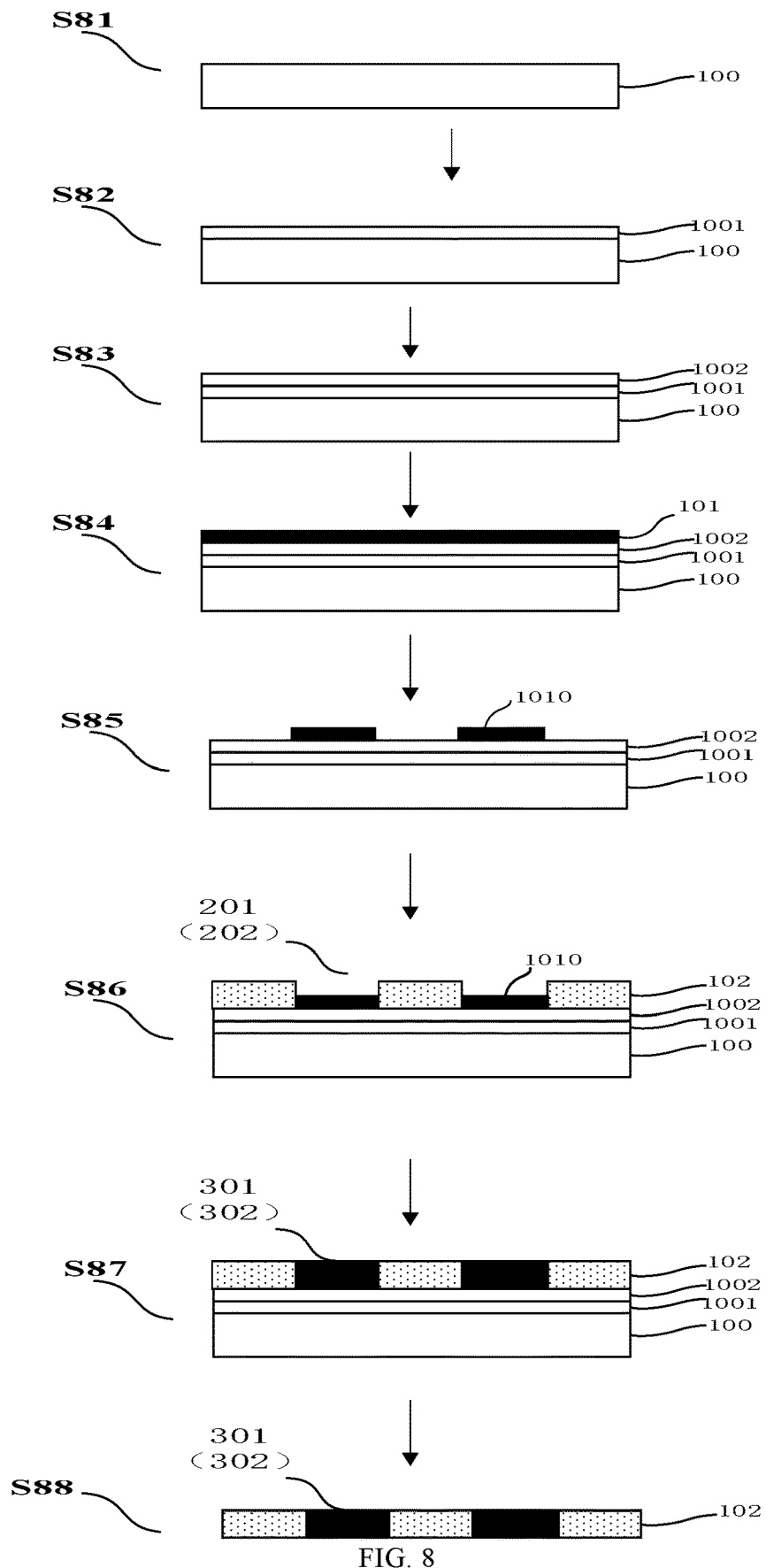
FIG. 8 is a flow chart of yet another method of manufacturing a metal mesh array shown in FIG. 3.

FIG. 8 is a flow chart of yet another method of manufacturing a metal mesh array shown in FIG. 3. As shown in FIG. 8, the manufacturing method of the metal mesh array specifically includes:

S81, providing a base substrate 100.

The step of S81 is the same as the step of S71, and is not repeated herein.

S82, forming the separation layer 1001 on the base substrate 100, wherein the separation layer 1001 covers the base substrate 100.

The step of S82 is the same as the step of S72, and is not repeated herein.

S83, forming the second metal layer 1002 on a side of the separation layer 1001 away from the base substrate 100.

The step of S83 is the same as the step of S73, and is not repeated herein.

S84, forming the first metal layer 101 on a side of the second metal layer 1002 away from the base substrate 100.

The first metal layer 101 may be formed on the side of the second metal layer 1002 away from the base substrate 100 by evaporation or sputtering, and the first metal layer 101 serves as a seed layer for electroplating.

S85, forming a plurality of metal patterns 1010 through a patterning process.

The plurality of metal patterns 1010 are formed through photoresist coating, developing, exposing, and etching processes.

S86, forming the first interlayer dielectric layer 102 on a side of a layer, where the plurality of metal patterns 101 are located, away from the base substrate 100, and then forming the plurality of first groove structures 201 and the plurality of second groove structures 202 arranged in an intersecting manner in the first interlayer dielectric layer 102, wherein the groove structures are in one-to-one correspondence with the metal patterns.

The first groove structures 201 and the second groove structures 202 in one-to-one correspondence with the metal patterns 1010 may be formed in the first interlayer dielectric layer 102 through the processes of hard mask and ICP, or through the nano-imprinting process and the inductively coupled plasma etching process.

S87, forming the plurality of first metal lines 301 located in the plurality of first groove structures 201 and the plurality of second metal lines 302 located in the plurality of second groove structures 202 through an electroplating process, where the first metal lines and the second metal lines are arranged in an intersecting manner, thereby forming the plurality of metal meshes.

The first metal lines 301 in the first groove structures 201 and the second metal lines 302 in the second groove structures 202 may be formed through a line electroplating process.

S88, stripping the separation layer 1001, and then, removing the second metal layer 1002 by etching, thereby obtaining the plurality of metal meshes 1000.

The separation layer 1001 and the base substrate 100 may be stripped by laser irradiation, so as to obtain the metal mesh array.

In this implementation, the first metal lines located in the first groove structures and the second metal lines located in the second groove structures are formed through the line electroplating process, which increases a uniformity of a line width of a metal line and improves the yield of the metal line, and may reduce the step of etching the first metal layer. In addition, the groove structures may be formed in the first interlayer dielectric layer through the processes of hard mask and ICP, or through the nano-imprinting process, which may ensure that the groove structures in the first interlayer dielectric layer are perpendicular to a surface of the base substrate, thereby facilitating a uniform line width of each metal mesh formed subsequently, and realizing an ultra-narrow line width of the formed metal line. Also, by providing the second metal layer, the adhesion of the first metal layer may be increased.

In some embodiments, after the step of S77 shown in FIG. 7, or after the step of S88 shown in FIG. 8, the method for manufacturing the metal mesh array may further include:

forming a flexible film on a side of the first interlayer dielectric layer away from the base substrate.

The film may be attached to the first interlayer dielectric layer 102 through an optical clear adhesive (OCA adhesive). The flexible film may be made of at least one of COP film, polyimide (PI), or polyethylene terephthalate (PET).

In the present embodiment, the metal mesh array is formed on the rigid base substrate, and then the metal mesh array with the stripped rigid substrate is attached to the flexible film, so that the attachment area of the flexible film may be increased.

Figure 9:
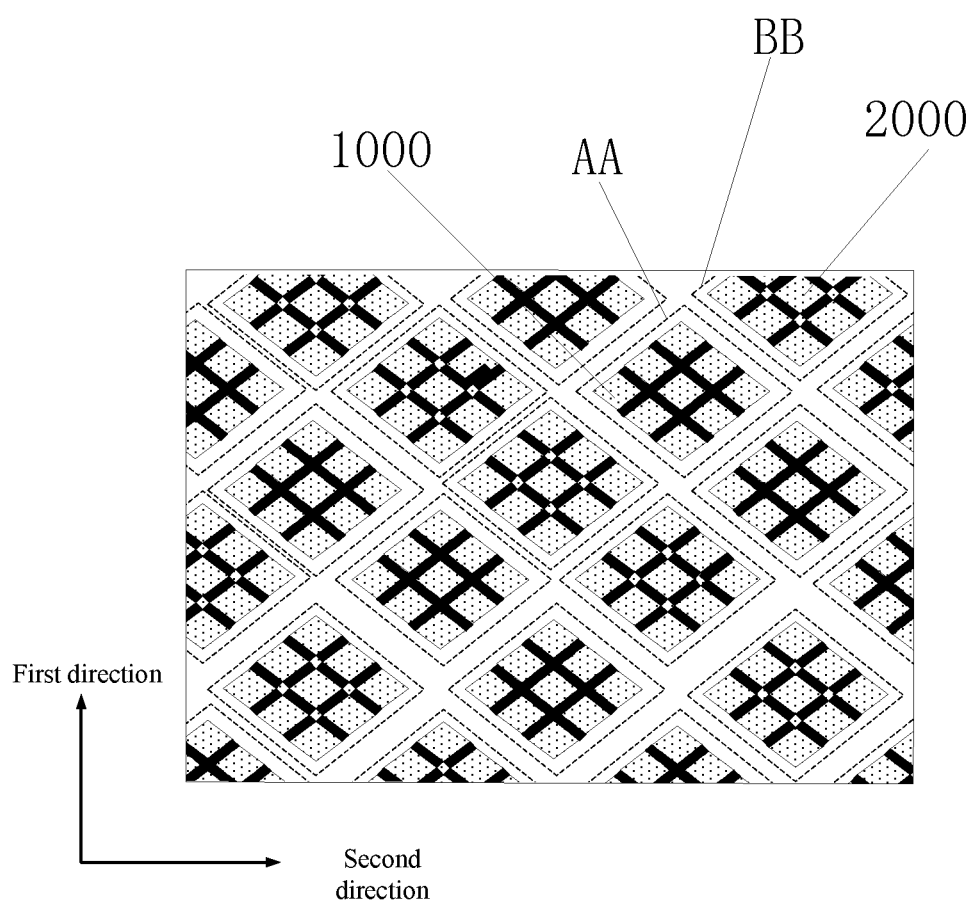
FIG. 9 is a schematic diagram of another structure of a metal mesh array according to an embodiment of the present disclosure.

FIG. 9 is a schematic diagram of another structure of a metal mesh array according to an embodiment of the present disclosure. As shown in FIG. 9, an embodiment of the present disclosure provides a metal mesh array, including a plurality of working areas AA and a plurality of redundant areas BB, and a plurality of metal meshes 1000 are disposed in the working areas AA and a plurality of redundant meshes 2000 are disposed in the redundant areas BB. The working areas AA and the redundant areas BB are alternately arranged in both a first direction and a second direction. That is, in the metal mesh array, the metal meshes 1000 positioned in the working areas AA are arranged at intervals in a row direction and also arranged at intervals in a column direction; and the redundant metal meshes 2000 positioned in the redundant areas BB are arranged at intervals in a row direction and also arranged at intervals in a column direction.

The working area AA refers to an area where the metal mesh array is in a working state, and the redundant area BB refers to an area where the metal mesh array is in a non-working state. That is, the mesh lines in the metal mesh 1000 in each working area AA are continuous, and there is no break point at a position where mesh lines intersect with each other; and the mesh lines in the redundant metal mesh 2000 in each redundant area BB are not continuous, and there is a break point at a position where mesh lines intersect with each other.

Figure 10:
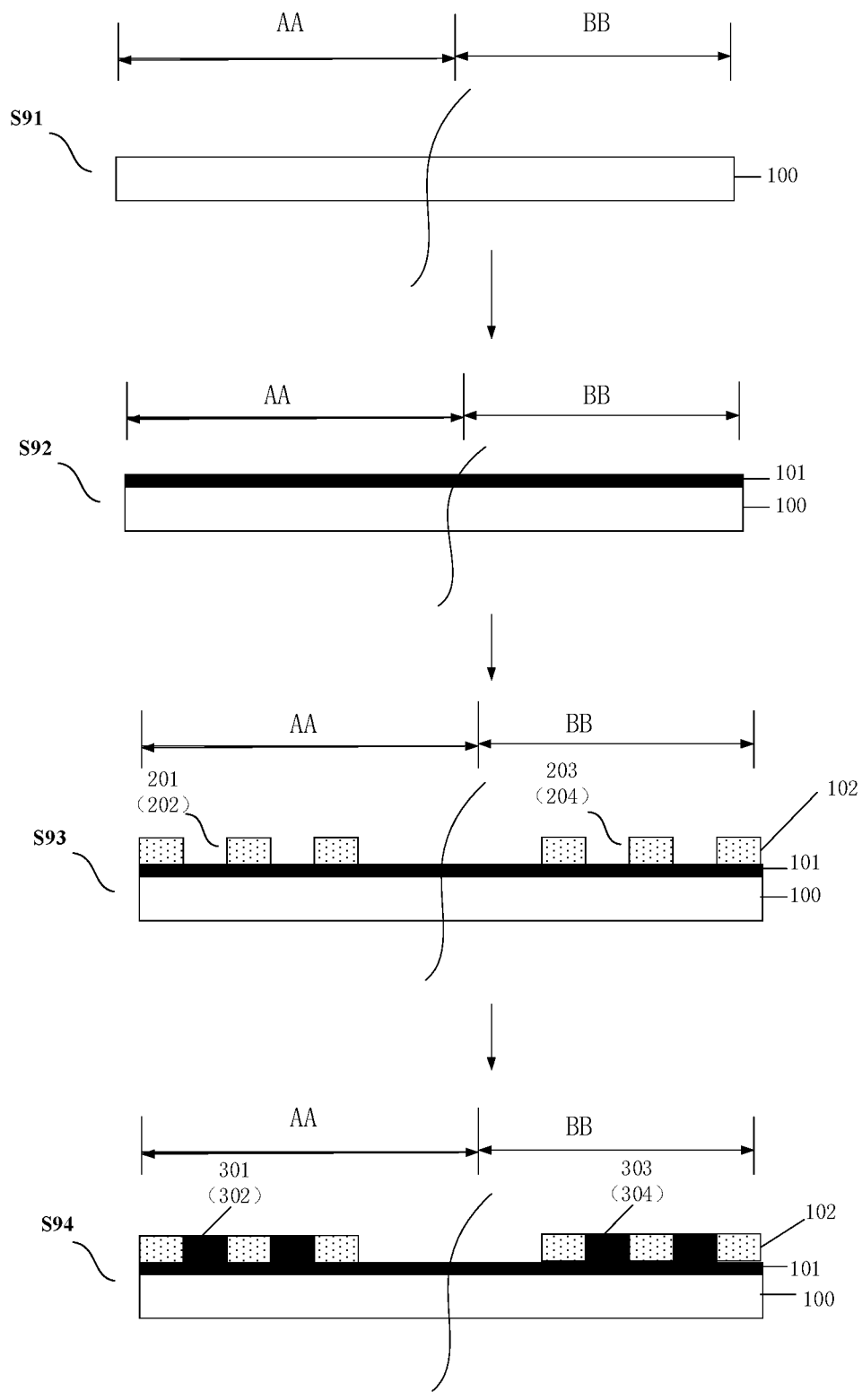
FIG. 10 is a flow chart of another method for manufacturing a metal mesh array according to an embodiment of the present disclosure.

FIG. 10 is a flow chart of a method for manufacturing a metal mesh array. As shown in FIG. 10, an embodiment of the present disclosure provides a method for manufacturing a metal mesh array, which is used for manufacturing the metal mesh array shown in FIG. 9. The method for manufacturing a metal mesh array includes the following steps:

S91, providing a base substrate 100.

In some examples, a material of the base substrate 100 may be a flexible material or a rigid material. In the present embodiment, as an example, the material of the base substrate 100 is the rigid material. The rigid material may include, but is not limited to, glass, sapphire, quartz, or the like.

S92, forming a first metal layer 101 as a seed layer on the base substrate 100.

The first metal layer 101 may be formed on the base substrate 100 by evaporation or sputtering and used as a seed layer for a subsequent electroplating process. A material of the first metal layer 101 may be selected as needed. For example, the material of the first metal layer 101 may be one or more of copper, titanium, aluminum, and silver.

S93, forming a first interlayer dielectric layer 102 on a side of the seed layer 101 away from the base substrate 100, where the first interlayer dielectric layer includes a plurality of first groove structures 201 and a plurality of second groove structures 202 located in the working areas (AA) and arranged in an intersecting manner (as shown in FIG. 5). The first interlayer dielectric layer 102 further includes a plurality of third groove structures 203 and a plurality of fourth groove structures 204 located in the redundant areas BB and arranged with extending directions thereof intersecting with each other, and a plurality of dividing blocks (205) located at positions where the extending directions of the third groove structures 203 and the extending directions of the fourth groove structures 204 intersect with each other. The dividing blocks divide the third groove structures 203 into a plurality of groove portions (2031), and the dividing blocks divide the fourth groove structures 204 into a plurality of groove portions (2041) (shown in FIG. 11).

A material of the first interlayer dielectric layer 102 includes, but is not limited to, an organic material or an inorganic material. For example, the organic material includes, but is not limited to, polyimide, epoxy, acryl, polyester, photoresist, polyacrylate, polyamide, siloxane and other resin materials. For example, the inorganic material includes, but is not limited to, silicon oxide (SiOx), silicon nitride (SiNx), hafnium oxide (HfOx), silicon oxynitride (SiON), aluminum oxide (AlOx), and the like.

When the material of the first interlayer dielectric layer 102 is an organic material, the first interlayer dielectric layer 102 may be formed on the side of the seed layer 101 away from the base substrate 100 through a coating or spin-coating process. When the material of the first interlayer dielectric layer 102 is an inorganic material, the first interlayer dielectric layer 102 may be formed on the side of the seed layer 101 away from the base substrate 100 through a plasma enhanced chemical vapor deposition method, a low pressure chemical vapor deposition method, an atmospheric pressure chemical vapor deposition method, an electron cyclotron resonance chemical vapor deposition method, or a sputtering method.

In this step, the plurality of first groove structures 201 and the plurality of second groove structures 202 arranged in an intersecting manner, the plurality of third groove structures 203 and the plurality of fourth groove structures 204 arranged in an intersecting manner, and the plurality of dividing blocks 205 located at positions where the extending directions of the third groove structures 203 and the extending directions of the fourth groove structures 204 intersect with each other. In an embodiment, the "patterning process" refers to a step of forming a structure having a specific pattern, and may be a photolithography process including one or more steps of forming a material layer, coating a photoresist, exposing, developing, etching, stripping a photoresist, and the like. Alternatively, the "patterning process" may also be an imprinting process, an inkjet printing process, or other processes.

It should be noted that in this embodiment, the first interlayer dielectric layer may include one or more layers. In this embodiment, the first interlayer dielectric layer is a single layer, as an example.

S94, performing an electroplating process on the seed layer 101 to form a plurality of first metal lines 301 located in the plurality of first groove structures 201 and a plurality of second metal lines 302 located in the plurality of second groove structures 202, wherein the first metal lines 301 and the second metal lines 302 in each working area AA are arranged in an intersecting manner, thereby forming a plurality of metal meshes 1000 in the working areas AA; and to form a plurality of third metal lines 303 located in the plurality of third groove structures 202 and a plurality of fourth metal lines 304 located in the plurality of fourth groove structures 204, wherein the plurality of third metal lines 303 and the plurality of fourth metal lines 304 are disconnected at positions where the third metal lines 303 and the fourth metal lines 304 intersect with each other, and the extending directions of the third metal lines 303 and the extending directions of the fourth metal lines 304 intersect with each other in each redundant area BB, thereby forming a plurality of redundant metal meshes 2000.

Figure 12:
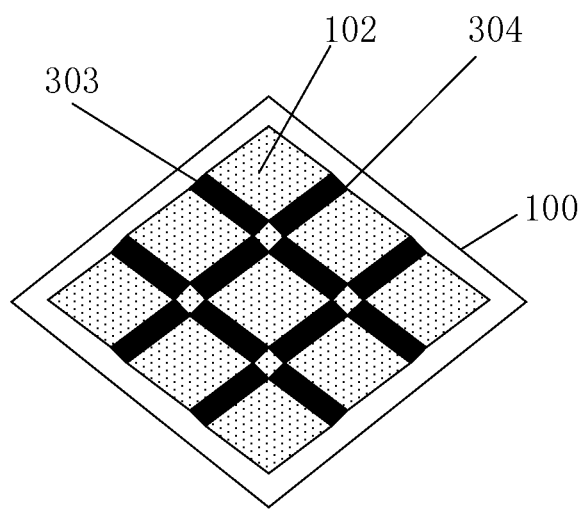
FIG. 12 is a top view of an intermediate product formed in a redundant area in step S94 of a method of manufacturing a metal mesh array according to an embodiment of the present disclosure.

The seed layer is electroplated through a line electroplating process to form the first metal lines 301 located in the first groove structures 201 and the second metal lines 302 located in the second groove structures 202, and the first metal lines 301 and the second metal lines 302 in each working area AA are arranged in an intersecting manner, thereby forming the plurality of metal meshes 1000 (a structure of the metal mesh is shown in FIG. 6). The third metal lines 303 located in the third groove structures 203 and the fourth metal lines 304 located in the fourth groove structures 204 are simultaneously formed, wherein the third metal lines 303 and the fourth metal lines 304 are disconnected at positions where the third metal lines 303 and the fourth metal lines 304 intersect with each other, and the extending directions of the third metal lines 303 and the extending directions of the fourth metal lines 304 intersect with each other in each redundant area BB, thereby forming the plurality of redundant metal meshes 2000 (a structure of the redundant metal mesh is shown in FIG. 12).

In this embodiment, the first metal lines 301 located in the first groove structures 201, the second metal lines 302 located in the second groove structures 202, the third metal lines 303 located in the third groove structures 203 and the fourth metal lines 304 located in the fourth groove structures 204 through a line electroplating process, which facilitates to increase a uniformity of a line width of a metal line and improve the yield of the metal line.

In some embodiments, the step of forming, in the first interlayer dielectric layer 102, the plurality of third groove structures 203 and the plurality of fourth groove structures 204 located in the redundant areas BB and arranged with extending directions thereof intersecting with each other, and the plurality of dividing blocks 205 located at positions where the extending directions of the third groove structures 203 and the extending directions of the fourth groove structures 204 intersect with each other, specifically includes:

The plurality of third groove structures 203 and the plurality of fourth groove structures 204 located in the plurality of redundant areas BB and arranged with extending directions thereof intersecting with each other, and the dividing block 205 are formed in the first interlayer dielectric layer 102 through a hard mask exposure process and an inductively coupled plasma etching process. Alternatively, the plurality of third groove structures 203 and the plurality of fourth groove structures 204 located in the plurality of redundant areas BB and arranged with extending directions thereof intersecting with each other, and the dividing blocks 205 are formed in the first interlayer dielectric layer 102 through a nano-imprinting process and an inductively coupled plasma etching process.

In this embodiment, the groove structures are formed in the first interlayer dielectric layer through the hard mask exposure process (or the nano-imprinting process) and the inductively coupled plasma etching process, which may ensure that the groove structures in the first interlayer dielectric layer are perpendicular to a surface of the base substrate, thereby facilitating a uniform line width of each metal mesh formed subsequently, and realizing an ultra-narrow line width of the formed metal line.

In some embodiments, after forming the plurality of redundant metal meshes and the plurality of metal meshes, the method further includes: forming a flexible film on a side of the first interlayer dielectric layer away from the base substrate.

In the present embodiment, the metal mesh array is formed on the rigid base substrate, and then the metal mesh array with the stripped rigid substrate is attached to the flexible film, so that the attachment area of the flexible film may be increased.

In order to more fully understand the present disclosure, several examples of a method for manufacturing a metal mesh in a metal array are illustrated below:

Example 1

Figure 13:
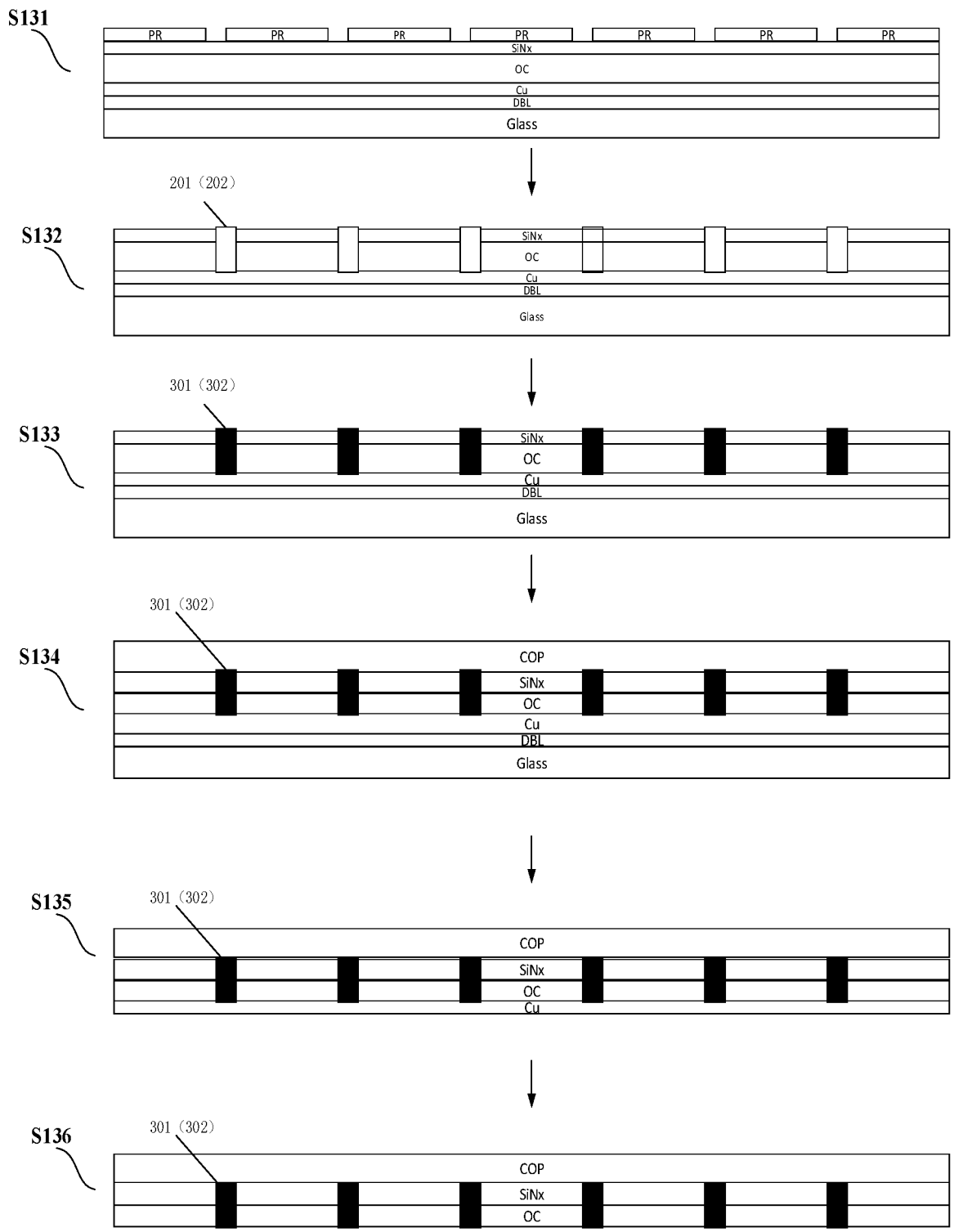
FIG. 13 is a flow chart of a method for manufacturing a metal mesh according to an embodiment of the present disclosure.

FIG. 13 is a flow chart of a method for manufacturing a metal mesh. As shown in FIG. 13, the method includes:

S131, providing a base substrate, wherein the base substrate is made of glass; forming a separation layer DBL on the glass base substrate, forming a copper thin film layer Cu on a side of the separation layer DBL away from the glass base substrate, and forming a first interlayer dielectric layer on a side of the copper thin film layer Cu away from the glass base substrate, wherein the first interlayer dielectric layer is of a double-side structure and includes an OC (optical clear adhesive) layer and an SiN layer; and then, coating a photoresist PR on the SiN layer.

S132, forming a plurality of first groove structures 201 and a plurality of second groove structures 202 penetrating through the OC layer and the SiN layer through a patterning process.

S133, performing an electroplating process on the copper thin film layer to form first metal lines 301 in the first groove structures 201 and second metal lines 302 in the second groove structures 202, namely, forming the metal mesh structure.

After forming the metal mesh structure, the method may further include:

S134, attaching a COP film to a side of the SiN layer away from the glass base substrate.

S135, stripping the separation layer DBL by laser irradiation.

S136, removing the copper thin film layer Cu by dry etching.

After S136, a second base substrate may be further attached to a side of the OC layer away from the COP film, where the second base substrate may be a panel of a mobile phone or the like.

Example 2

Figure 14:
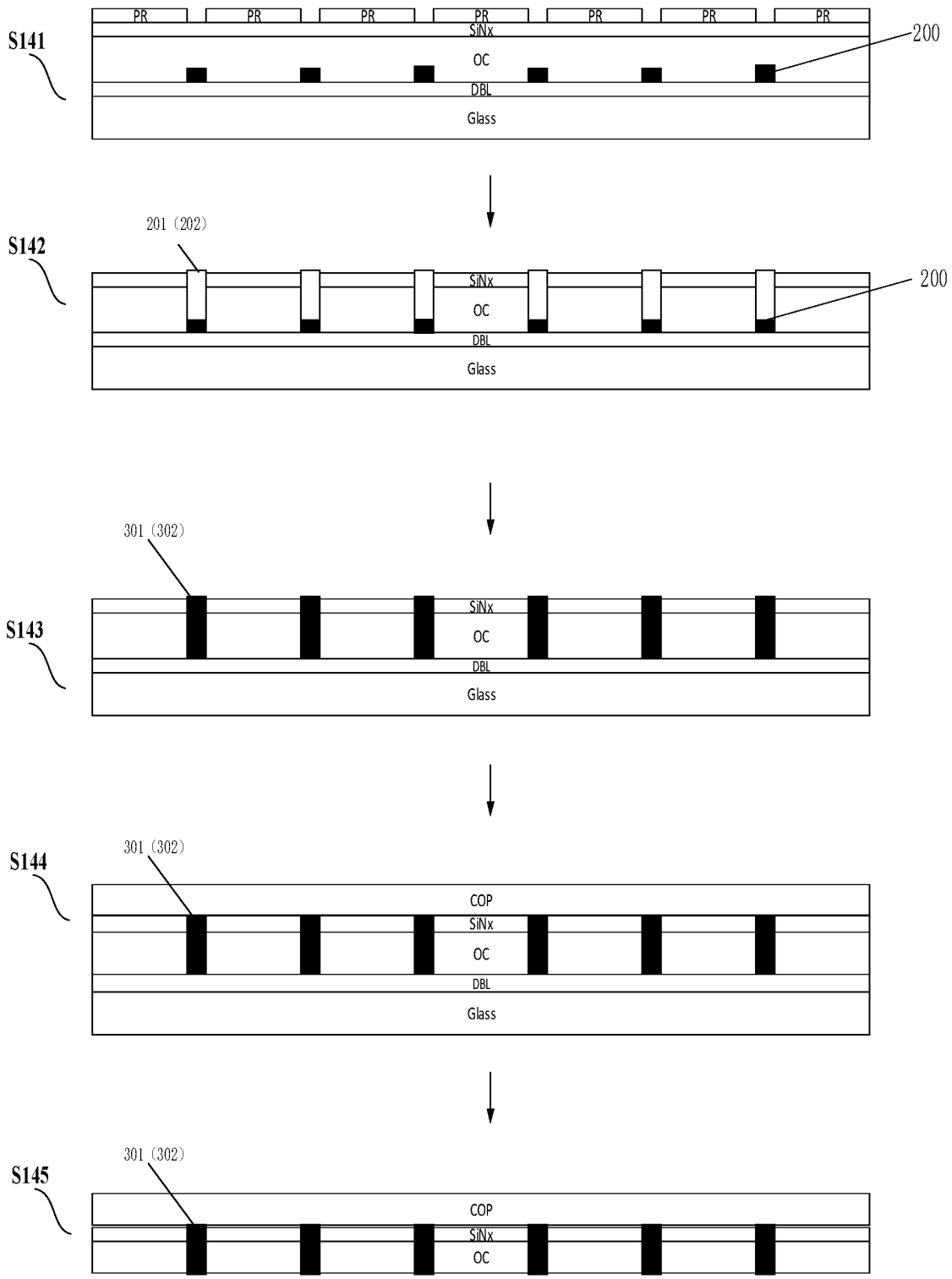
FIG. 14 is a flow chart of another method for manufacturing a metal mesh according to an embodiment of the present disclosure.

FIG. 14 is a flow chart of another method for manufacturing a metal mesh. As shown in FIG. 14, the method includes:

S141, providing a glass base substrate Glass; forming a separation layer DBL on the glass base substrate, forming a copper thin film layer Cu on a side of the separation layer DBL away from the glass base substrate, and forming a plurality of metal patterns 200 on the copper thin film layer Cu through a patterning process; forming a first interlayer dielectric layer on a side of the plurality of metal patterns 200 away from the glass base substrate Glass, wherein the first interlayer dielectric layer is of a double-side structure and includes an OC (optical clear adhesive) layer and an SiN layer; and then, coating a photoresist PR on the SiN layer.

S142, forming a plurality of first groove structures 201 and a plurality of second groove structures 202 penetrating through the OC layer and the SiN layer through a patterning process, wherein the groove structures are arranged corresponding to the metal patterns.

S143, performing an electroplating process on the copper thin film layer Cu to form first metal lines 301 in the first groove structures 201 and second metal lines 302 in the second groove structures 202, namely, forming the metal mesh structure.

After forming the metal mesh structure, the method may further include:

S144, attaching a COP film to a side of the SiN layer away from the glass base substrate.

S145, stripping the separation layer DBL by laser irradiation.

After S145, a second base substrate may be further attached to a side of the OC layer away from the COP film, where the second base substrate may be a panel of a mobile phone or the like.

Example 3

Figure 15:
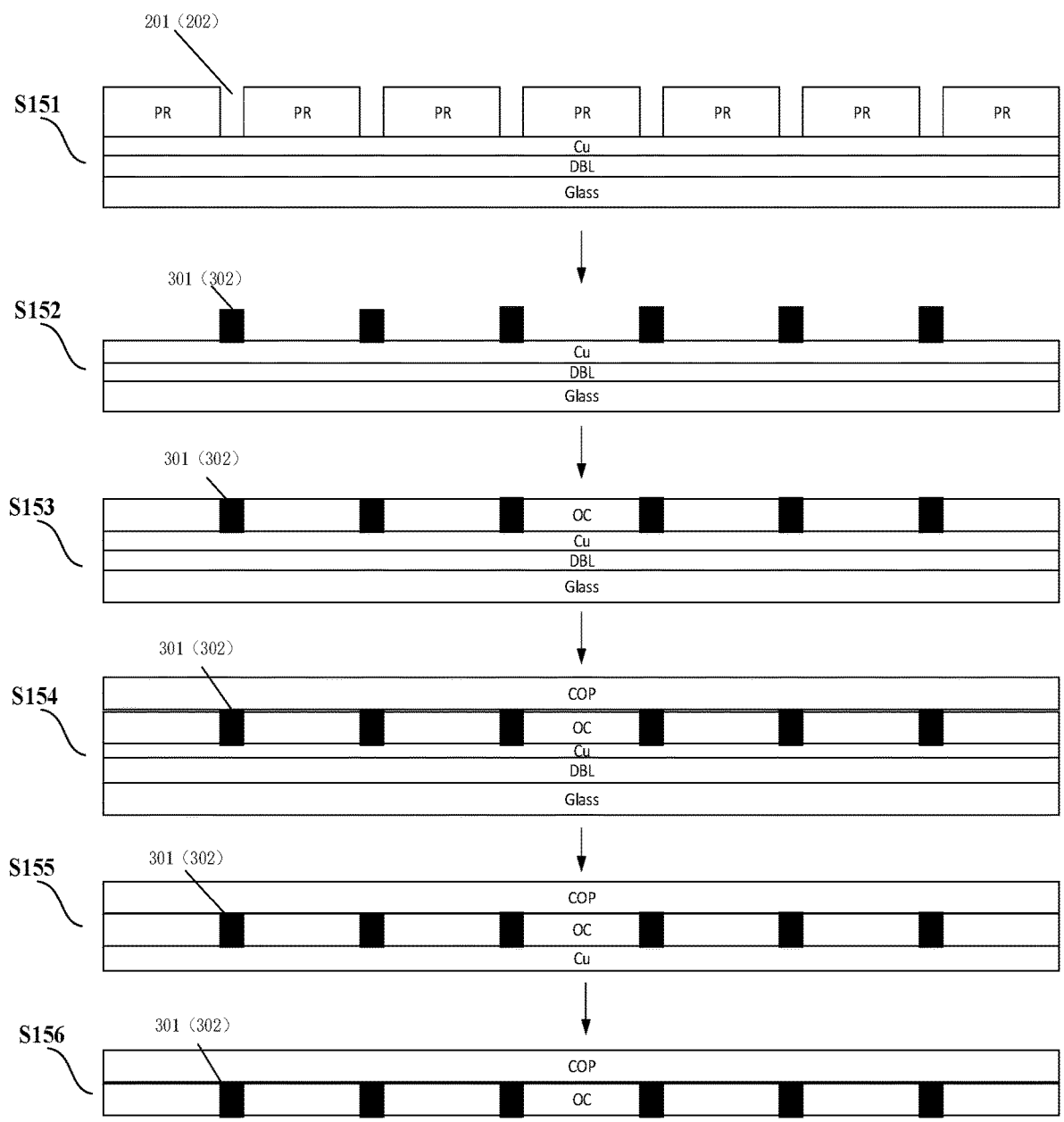
FIG. 15 is a flow chart of yet another method for manufacturing a metal mesh according to an embodiment of the present disclosure.

FIG. 15 is a flow chart of yet another method for manufacturing a metal mesh. As shown in FIG. 15, the method includes:

S151, providing a glass base substrate Glass; forming a separation layer DBL on the glass base substrate, forming a copper thin film layer Cu on a side of the separation layer DBL away from the glass base substrate, and coating a photoresist PR on the copper thin film layer away from the glass base substrate; forming the plurality of first groove structures 201 and the plurality of second groove structures 202 penetrating through the photoresist layer through an exposure process and a development process.

S152, performing an electroplating process on the copper thin film layer to form first metal lines 301 in the first groove structures 201 and second metal lines 302 in the second groove structures 202.

S153, forming an OC layer (i.e., an interlayer dielectric layer) on the first metal lines 301 and the second metal lines 302.

S154, attaching a COP film on a side of the OC layer away from the glass base substrate.

S155, stripping the separation layer DBL by laser irradiation.

S156, removing the copper thin film layer Cu by dry etching.

After S156, a second base substrate may be further attached to a side of the OC layer away from the COP film, where the second base substrate may be a panel of a mobile phone or the like.

It should be noted that the manufacturing of the redundant metal meshes may be achieved only by changing the mask in the above embodiment, which is not illustrated here.

The embodiment of the present disclosure provides a metal mesh array, as shown in FIGS. 3, 5, and 6, the metal mesh array includes a plurality of working areas AA and a plurality of redundant areas BB. The working areas AA and the redundant areas BB are alternately arranged in both a first direction and a second direction. The metal mesh array includes a base substrate 100, a first metal layer 101, a first interlayer dielectric layer 102, and a plurality of metal meshes 1000.

Specifically, the first metal layer 101 is disposed on the base substrate 100, the first interlayer dielectric layer 102 is disposed on a side of the first metal layer 101 away from the base substrate 100, and the first interlayer dielectric layer 102 includes a plurality of first groove structures 201 and a plurality of second groove structures 202 located in the working areas AA and arranged in an intersecting manner. The plurality of metal meshes 1000 include a plurality of first metal lines 301 located in the plurality of first groove structures 201 and a plurality of second metal lines 302 located in the plurality of second groove structures 202.

Figure 11:
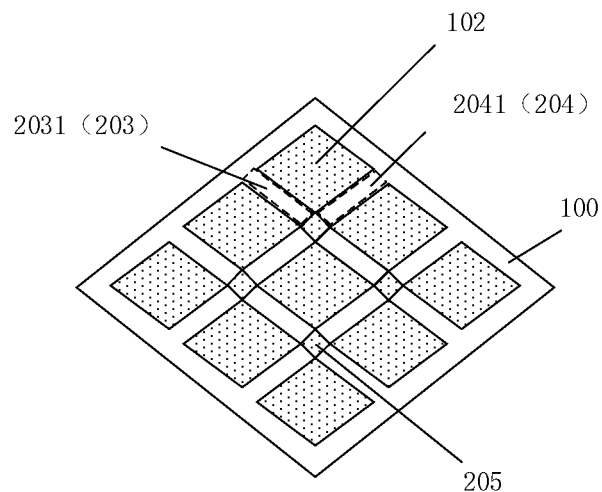
FIG. 11 is a top view of an intermediate product formed in a redundant area in step S93 of a method of manufacturing a metal mesh array according to an embodiment of the present disclosure.

The embodiment of the present disclosure further provides a metal mesh array. As shown in FIG. 9, FIG. 11, and FIG. 12, the metal mesh array includes a plurality of working areas AA and a plurality of redundant areas BB. The working areas AA and the redundant areas BB are alternately arranged in both a first direction and a second direction. The metal mesh array includes a base substrate 100, a first metal layer 101, a first interlayer dielectric layer 102, a plurality of metal meshes 1000 and a plurality of redundant metal meshes 2000.

Specifically, the first metal layer 101 is disposed on the base substrate 100, the first interlayer dielectric layer 102 is disposed on a side of the first metal layer 101 away from the base substrate 100, and the first interlayer dielectric layer 102 includes a plurality of first groove structures 201 and a plurality of second groove structures 202 located in the working areas AA and arranged in an intersecting manner. The first interlayer dielectric layer 102 further includes a plurality of third groove structures 203 and a plurality of fourth groove structures 204 located in the redundant areas BB and arranged with extending directions thereof intersecting with each other, and a plurality of dividing blocks 205 located at positions where the extending directions of the third groove structures 203 and the extending directions of the fourth groove structures 204 intersect with each other. The dividing blocks divide the third groove structures 203 into a plurality of groove portions 2031, and the dividing blocks divide the fourth groove structures 204 into a plurality of groove portions 2041.

The plurality of metal meshes include first metal lines 301 arranged in the plurality of first groove structures 201 and second metal lines 302 arranged in the plurality of second groove structures 202. The plurality of redundant metal meshes 2000 include third metal lines 303 disposed in the plurality of third groove structures 203 and fourth metal lines 304 disposed in the plurality of fourth groove structures 204.

The embodiment of the present disclosure further provides a method for manufacturing a thin film sensor, which may include the method for manufacturing the metal mesh array.

Since the method for manufacturing the thin film sensor in the embodiment of the present disclosure includes the above method for manufacturing the metal mesh array, the thin film sensor formed by the method has a high transmittance, and the influence on the optical effect of the display device is obviously reduced in the display device adopting the thin film sensor.

The embodiment of the present disclosure also provides a thin film sensor, which may be manufactured by the method. The thin film sensor includes, but is not limited to, a transparent antenna. The metal mesh in the thin film sensor in the embodiment of the present disclosure is manufactured by the above method, so the line width of the metal is not greater than 2 μm, for example, less than 1.5 μm.

The thin film sensor may include an antenna. The antennas in the disclosed embodiments may also be used in glazing window systems for automobiles, trains (including high-speed rails), aircraft, buildings, or the like. The antenna may be fixed to the inside of the glazing window (a side closer to the room). Because the optical transmittance of the antenna is high, the antenna has little influence on the transmittance of the glazing window while realizing the communication function, the antenna also tends to be a beautified antenna. The glazing window in the embodiments of the present disclosure includes, but is not limited to, double glass, and the type of the glazing window may also be single glass, laminated glass, thin glass, thick glass, or the like.

In some examples, an antenna apparatus provided by the embodiments of the present disclosure further includes a transceiver unit, a radio frequency transceiver, a signal amplifier, a power amplifier, and a filtering unit. The antenna in the antenna apparatus may be a transmitting antenna or a receiving antenna. The transceiver unit may include a baseband and a receiving terminal, wherein the baseband provides signals of at least one frequency band, for example, provides 2G signals, 3G signals, 4G signals, 5G signals, or the like, and sends the signals of at least one frequency band to the radio frequency transceiver. After receiving the signals, the antenna in the antenna apparatus may transmit the signals to the receiving terminal in the transceiver unit after the signals are processed by the filtering unit, the power amplifier, the signal amplifier, and the radio frequency transceiver. The receiving terminal may be, for example, an intelligent gateway.

Furthermore, the radio frequency transceiver is connected to the transceiver unit, and is configured to modulate a signal transmitted by the transceiver unit, or demodulate a signal received by the antenna and transmit the modulated signal to the transceiver unit. Specifically, the radio frequency transceiver may include a transmitting circuit, a receiving circuit, a modulating circuit, and a demodulating circuit. After the transmitting circuit receives multiple types of signals provided by the baseband, the modulating circuit may modulate the multiple types of signals provided by the baseband and then transmit the signals to the antenna. The antenna receives signals and transmits the signals to the receiving circuit of the radio frequency transceiver, the receiving circuit transmits the signals to the demodulating circuit, and the demodulating circuit demodulates the signals and transmits the demodulated signals to the receiving terminal.

Furthermore, the radio frequency transceiver is connected to the signal amplifier and the power amplifier, which are in turn connected to the filtering unit. The filtering unit is connected to at least one antenna. In the process of transmitting signals by the antenna apparatus, the signal amplifier is configured to improve a signal-to-noise ratio of signals output by the radio frequency transceiver and then transmit the signals to the filtering unit; the power amplifier is configured to amplify the power of the signals output by the radio frequency transceiver and then transmit the signals to the filtering unit; the filtering unit specifically includes a duplexer and a filtering circuit, the filtering unit combines signals output by the signal amplifier and the power amplifier and filters noise waves in the signals and then transmits the signals to the at least one antenna, and the at least one antenna radiates the signals outward. In the process of receiving signals by the antenna apparatus, the signals received by the at least one antenna are transmitted to the filtering unit, the filtering unit filters noise waves in the signals received by the at least one antenna and then transmits the signals to the signal amplifier and the power amplifier, and the signals received by the at least one antenna are gained by the signal amplifier to increase the signal-to-noise ratio of the signals; the power amplifier amplifies the power of signals received by the at least one antenna. The signals received by the at least one antenna are processed by the power amplifier and the signal amplifier and then transmitted to the radio frequency transceiver, and are further transmitted the radio frequency transceiver to the transceiver unit.

In some examples, the signal amplifier may include various types of signal amplifiers, such as a low noise amplifier, which is not limited here.

In some examples, the antenna apparatus provided by the embodiments of the present disclosure further includes a power management unit connected to the power amplifier and for providing the power amplifier with a voltage for amplifying the signals.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A method for manufacturing a metal mesh array, wherein the metal mesh array comprises a plurality of working areas and a plurality of redundant areas; the plurality of working areas and the plurality of redundant areas are alternately arranged in both a first direction and a second direction; wherein the method comprises:
   providing a base substrate;
   forming a first metal layer on the base substrate as a seed layer;
   forming a first interlayer dielectric layer on a side of the seed layer away from the base substrate; wherein the first interlayer dielectric layer comprises a plurality of first groove structures and a plurality of second groove structures in the plurality of working areas and arranged in an intersecting manner; and
   performing an electroplating process on the seed layer to form a plurality of first metal lines in the plurality of first groove structures and a plurality of second metal lines in the plurality of second groove structures, wherein the plurality of first metal lines and the plurality of second metal lines in the plurality of working areas are arranged in an intersecting manner, thereby forming a plurality of metal meshes;
   wherein the first interlayer dielectric layer further comprises a plurality of third groove structures and a plurality of fourth groove structures in the plurality of redundant areas and arranged with extending directions thereof intersecting with each other, and a plurality of dividing blocks at positions where the extending directions of the plurality of third groove structures and the extending directions of the plurality of fourth groove structures intersect with each other; the plurality of dividing blocks divide the plurality of third groove structures into a plurality of groove portions, and divide the plurality of fourth groove structures into a plurality of groove portions; and
   when performing an electroplating process on the seed layer to form a plurality of first metal lines in the plurality of first groove structures and a plurality of second metal lines in the plurality of second groove structures, the method further comprises:

forming a plurality of third metal lines in the plurality of third groove structures and a plurality of fourth metal lines in the plurality of fourth groove structures, wherein the plurality of third metal lines and the plurality of fourth metal lines are disconnected at positions where the plurality of third metal lines and the plurality of fourth metal lines intersect with each other, and extending directions of the plurality of third metal lines and the plurality of fourth metal lines intersect with each other in the plurality of redundant areas, thereby forming a plurality of redundant metal meshes.

2. The method for manufacturing a metal mesh array according to claim 1, wherein the forming the first interlayer dielectric layer comprises:
through a hard mask exposure process and an inductively coupled plasma etching process, forming the plurality of first groove structures and the plurality of second groove structures in the plurality of working areas and arranged in an intersecting manner in the first interlayer dielectric layer; and/or forming the plurality of third groove structures and the plurality of fourth groove structures in the plurality of redundant areas and arranged with extending directions thereof intersecting with each other.

3. The method for manufacturing a metal mesh array according to claim 1, wherein the forming the first interlayer dielectric layer comprises:
through a nano-imprinting process and an inductively coupled plasma etching process, forming the plurality of first groove structures and the plurality of second groove structures in the plurality of working areas and arranged in an intersecting manner in the first interlayer dielectric layer; and/or forming the plurality of third groove structures and the plurality of fourth groove structures in the plurality of redundant areas and arranged with extending directions thereof intersecting with each other.

4. The method for manufacturing a metal mesh array according to claim 1, wherein the forming a first metal layer on the base substrate as a seed layer comprises:
depositing a first metal layer on one side of the base substrate, wherein the first metal layer covers the base substrate; and
wherein after the performing an electroplating process on the seed layer to form a plurality of first metal lines in the plurality of first groove structures and a plurality of second metal lines in the plurality of second groove structures, the method further comprises:
stripping the base substrate; and
removing a part of a material of the seed layer outside the plurality of first groove structures and the plurality of second groove structures in the first interlayer dielectric layer.

5. The method for manufacturing a metal mesh array according to claim 1, wherein the forming a first metal layer on the base substrate as a seed layer comprises:
depositing a first metal layer on one side of the base substrate, and forming a plurality of metal patterns through a patterning process; and
forming the first interlayer dielectric layer on a side of the seed layer away from the base substrate; and in the step that the first interlayer dielectric layer comprises a plurality of first groove structures and a plurality of second groove structures in the plurality of working areas and arranged in an intersecting manner, the plurality of first groove structures and the plurality of second groove structures are arranged corresponding to the plurality of metal patterns.

6. The method for manufacturing a metal mesh array according to claim 1, wherein after providing a base substrate, the method further comprises:
forming a second metal layer on one side of the base substrate; and
the forming a first metal layer as a seed layer on the base substrate comprises:
forming the first metal layer on a side of the second metal layer away from the base substrate, wherein an orthographic projection of the first metal layer on the base substrate coincides with an orthographic projection of the second metal layer on the base substrate.

7. The method for manufacturing a metal mesh array according to claim 6, wherein before the forming a second metal layer on one side of the base substrate, the method further comprises:
forming a separation layer on the base substrate, wherein the separation layer covers the base substrate.

8. The method for manufacturing a metal mesh array according to claim 1, wherein after forming the plurality of metal meshes, the method further comprises:
forming a flexible film on a side of the first interlayer dielectric layer away from the base substrate.

9. The method for manufacturing a metal mesh array according to claim 1, wherein after forming the plurality of redundant metal meshes, the method further comprises:
forming a flexible film on a side of the first interlayer dielectric layer away from the base substrate.

10. A metal mesh array, comprising a plurality of working areas and a plurality of redundant areas; wherein the plurality of working areas and the plurality of redundant areas are alternately arranged in both a first direction and a second direction; the metal mesh array comprises:
a base substrate;
a first metal layer on the base substrate;
a first interlayer dielectric layer on a side of the first metal layer away from the base substrate, wherein the first interlayer dielectric layer comprises a plurality of first groove structures and a plurality of second groove structures in the plurality of working areas and arranged in an intersecting manner; and
a plurality of metal meshes, which comprise a plurality of first metal lines in the plurality of first groove structures and a plurality of second metal lines in the plurality of second groove structures;
wherein the first interlayer dielectric layer further comprises a plurality of third groove structures and a plurality of fourth groove structures in the plurality of redundant areas and arranged with extending directions thereof intersecting with each other, and a plurality of dividing blocks at positions where the extending directions of the plurality of third groove structures and the extending directions of the plurality of fourth groove structures intersect with each other; the plurality of dividing blocks divide the plurality of third groove structures into a plurality of groove portions, and divide the plurality of fourth groove structures into a plurality of groove portions; and
the metal mesh array further comprises:
a plurality of redundant metal meshes, which comprise a plurality of third metal lines in the plurality of third groove structures and a plurality of fourth metal lines in the plurality of fourth groove structures.

11. A thin film sensor, comprising the metal mesh array according to claim 10.

12. A method of manufacturing a thin film sensor, comprising a method for manufacturing a metal mesh array, wherein the metal mesh array comprises a plurality of working areas and a plurality of redundant areas; the plurality of working areas and the plurality of redundant areas are alternately arranged in both a first direction and a second direction; wherein the method comprises:
provide a base substrate;
forming a first metal layer on the base substrate as a seed layer;
forming a first interlayer dielectric layer on a side of the seed layer away from the base substrate; wherein the first interlayer dielectric layer comprises a plurality of first groove structures and a plurality of second groove structures in the plurality of working areas and arranged in an intersecting manner; and
performing an electroplating process on the seed layer to form a plurality of first metal lines in the plurality of first groove structures and a plurality of second metal lines in the plurality of second groove structures, wherein the plurality of first metal lines and the plurality of second metal lines in the plurality of working areas are arranged in an intersecting manner, thereby forming a plurality of metal meshes;
wherein the first interlayer dielectric layer further comprises a plurality of third groove structures and a plurality of fourth groove structures in the plurality of redundant areas and arranged with extending directions thereof intersecting with each other, and a plurality of dividing blocks at positions where the extending directions of the plurality of third groove structures and the extending directions of the plurality of fourth groove structures intersect with each other; the plurality of dividing blocks divide the plurality of third groove structures into a plurality of groove portions, and divide the plurality of fourth groove structures into a plurality of groove portions; and
when performing an electroplating process on the seed layer to form a plurality of first metal lines in the plurality of first groove structures and a plurality of second metal lines in the plurality of second groove structures, the method further comprises:
forming a plurality of third metal lines in the plurality of third groove structures and a plurality of fourth metal lines in the plurality of fourth groove structures, wherein the plurality of third metal lines and the plurality of fourth metal lines are disconnected at positions where the plurality of third metal lines and the plurality of fourth metal lines intersect with each other, and extending directions of the plurality of third metal lines and the plurality of fourth metal lines intersect with each other in the plurality of redundant areas, thereby forming a plurality of redundant metal meshes.

13. The method of manufacturing a thin film sensor of claim 12, wherein the forming the first interlayer dielectric layer comprises:
through a hard mask exposure process and an inductively coupled plasma etching process, forming the plurality of first groove structures and the plurality of second groove structures in the plurality of working areas and arranged in an intersecting manner in the first interlayer dielectric layer; and/or forming the plurality of third groove structures and the plurality of fourth groove structures in the plurality of redundant areas and arranged with extending directions thereof intersecting with each other.

14. The method of manufacturing a thin film sensor of claim 12, wherein the forming the first interlayer dielectric layer comprises:
through a nano-imprinting process and an inductively coupled plasma etching process, forming the plurality of first groove structures and the plurality of second groove structures in the plurality of working areas and arranged in an intersecting manner in the first interlayer dielectric layer; and/or forming the plurality of third groove structures and the plurality of fourth groove structures in the plurality of redundant areas and arranged with extending directions thereof intersecting with each other.

15. The method of manufacturing a thin film sensor of claim 12, wherein the forming a first metal layer on the base substrate as a seed layer comprises:
depositing a first metal layer on one side of the base substrate, wherein the first metal layer covers the base substrate; and
wherein after the performing an electroplating process on the seed layer to form a plurality of first metal lines in the plurality of first groove structures and a plurality of second metal lines in the plurality of second groove structures, the method further comprises:
stripping the base substrate; and
removing a part of a material of the seed layer outside the plurality of first groove structures and the plurality of second groove structures in the first interlayer dielectric layer.

16. The method of manufacturing a thin film sensor of claim 12, wherein the forming a first metal layer on the base substrate as a seed layer comprises:
depositing a first metal layer on one side of the base substrate, and forming a plurality of metal patterns through a patterning process; and
forming the first interlayer dielectric layer on a side of the seed layer away from the base substrate; and in the step that the first interlayer dielectric layer comprises a plurality of first groove structures and a plurality of second groove structures in the plurality of working areas and arranged in an intersecting manner, the plurality of first groove structures and the plurality of second groove structures are arranged corresponding to the plurality of metal patterns.

* * * * *